(12) United States Patent
Kang et al.

(10) Patent No.: US 7,436,913 B2
(45) Date of Patent: Oct. 14, 2008

(54) AUTOMATIC GAIN CONTROL APPARATUS

(75) Inventors: Hun Sik Kang, Dae-jeon (KR); Dae Hwan Hwang, Daejeon (KR); Ji Eun Kim, Dae-jeon (KR); Jein Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 601 days.

(21) Appl. No.: 10/986,645

(22) Filed: Nov. 12, 2004

(65) Prior Publication Data

US 2005/0135513 A1 Jun. 23, 2005

(30) Foreign Application Priority Data

Dec. 19, 2003 (KR) ............... 10-2003-0093553

(51) Int. Cl.
*H04L 27/08* (2006.01)

(52) U.S. Cl. .............. 375/345; 455/234.1; 455/245.1

(58) Field of Classification Search ........... 375/345; 330/129, 254, 289; 455/234.2
See application file for complete search history.

(56) References Cited

U.S. PATENT DOCUMENTS

| | | | |
|---|---|---|---|
| 4,534,010 A * | 8/1985 | Kobayashi et al. ......... 708/503 |
| 5,606,284 A | 2/1997 | Tamesue et al. |
| 5,617,060 A | 4/1997 | Wilson et al. |
| 6,167,488 A * | 12/2000 | Koppala .................. 711/132 |
| 6,597,898 B1 | 7/2003 | Iwata et al. |
| 6,843,597 B1 * | 1/2005 | Li et al. .................... 375/345 |
| 7,333,784 B2 * | 2/2008 | Jin et al. .................. 455/127.2 |
| 2002/0160733 A1 | 10/2002 | Kajita |

FOREIGN PATENT DOCUMENTS

| | | |
|---|---|---|
| JP | 4-127704 | 4/1992 |
| JP | 9-284073 | 10/1997 |
| JP | 2001-284996 | 10/2001 |
| JP | 2002-247121 | 8/2002 |
| KR | 00251694 | 1/2000 |

* cited by examiner

*Primary Examiner*—Shuwang Liu
*Assistant Examiner*—Lihong Yu
(74) *Attorney, Agent, or Firm*—Blakely, Sokoloff, Taylor & Zafman LLP

(57) ABSTRACT

The present invention relates an automatic gain control device, which performs a high-speed gain control operation in high-speed data communication using burst signals, generates a gain code without using a memory or storage device to simplify a system configuration, and establishes a correct gain control operation. The automatic gain control apparatus includes a power detector for calculating a mean power of the output signal of the variable gain amplifier; a gain code generator for receiving a mean power from the power detector, and generating a gain code corresponding to the received mean power; and a voltage generator for calculating a difference between the gain code and a target gain code associated with the output signal of the variable gain amplifier to detect an error code, and generating a gain control voltage for compensating for the difference between the two gain codes on the basis of the detected error code.

10 Claims, 11 Drawing Sheets

| Input voltage① (mVrms) | ADC output ② (equivalent decimal No) | Power ③ | Binary code for ③ ④ | AGC gain level ⑤ | Control gain(dB) ⑥ |
|---|---|---|---|---|---|
| 600 | 513 | 26319 | 10000000010000000001 | — | |
| 251.19 | 215 | 46225 | 00010110100100010001 | 1 | −8.06dB |
| 230.77 | 197 | 38809 | 00010010111110011001 | 2 | |
| ... | ... | ... | ... | ... | |
| 141 | 121 | 14641 | 00000111001001100001 | 7 | −3.07 |
| 100 | 85 | 7225 | 00000001110001110001 | 11 | 0 |
| ... | ... | ... | ... | ... | |
| 1.17 | 1 | 1 | 00000000000000000001 | 63 | 38.859 |

Reference voltage (target value)

Underflow position

FIG. 3

AUTOMATIC GAIN CONTROL APPARATUS

BACKGROUND OF THE INVENTION

1. Field of the Invention

The present invention relates to an automatic gain control apparatus, and more particularly to an automatic gain control apparatus for controlling the magnitude of a reception signal for use in wired/wireless communication such that it can optimally control a plurality of devices contained in a receiver.

2. Description of the Related Art

Typically, an automatic gain controller (AGC) for use in wired/wireless communication guarantees stable operations of a variety of devices contained in a reception end, for example, a timing recovery device, a carrier recovery device, and an equalizer, etc., and maintains the magnitude of a reception signal at a desired level, resulting in reduction of overall performance of a receiver. The magnitude of input signals of the reception end for use in general wired/wireless communication varies with transmission and channel conditions. In this case, provided that the magnitude of input signals is contained in a prescribed dynamic range during which a plurality of blocks contained in the receiver can be operated, overall performances of the receiver may be unexpectedly damaged. Therefore, the automatic gain controller has been adapted to solve the aforementioned problems.

FIG. 1 is a block diagram illustrating a conventional automatic gain control device. Referring to FIG. 1, the conventional automatic gain control device includes an analog signal processor (also called an analog front end block) 110 for processing consecutive analog signals in association with a reception signal S20, and an automatic gain controller 120 for controlling a gain of the analog processor 110. The analog signal processor 110 includes a first analog signal processor 111 for performing a variety of operations, e.g., amplification, BPF (Band Pass Filtering), and frequency conversion operations, etc.; a variable gain amplifier 112 for amplifying the input signal S20 at an amplification rate having been controlled by the gain-controlled voltage calculated by the automatic gain controller 120; and a second analog signal processor 113 for performing a variety of operations on the amplified signal received from the variable gain amplifier 112, for example, LPF (Low Pass Filtering) and ADC (Analog-to-Digital Conversion) operations, etc. The automatic gain controller 120 includes a level detector 121 for detecting a level of an output signal S 21 of the analog signal processor 110; an LPF (Low Pass Filter) 122 for performing an LPF operation on an output signal of the level detector 121; a subtracter 123 for calculating a difference between an output voltage and a reference voltage of the LPF 122 to generate an error signal; and a multiplier 124 for multiplying a loop gain coefficient by an error signal, and applying the multiplied result to a gain control voltage.

The level detector 121 can be configured in the form of a full-wave rectifier. The level detector 121 squares the output signal S21 so that the output signal of the level detector 121 is equal to a power signal of the signal S21. The LPF 122 has an output signal indicative of an integral signal associated with the power signal. In more detail, the output signal of the LPF 122 is indicative of a mean magnitude of the signal S21. Therefore, the subtracter 123 generates a difference (i.e., an error signal) between a true gain of the output signal S21 of the analog signal processor 110 and a target reference gain (i.e., a reference voltage). The multiplier 124 multiplies a loop gain coefficient (also called a loop gain constant) by the error signal, and thereby generates a gain control signal S22 of the variable gain amplifier 112.

A time response characteristic of the aforementioned conventional automatic gain control device is determined by a bandwidth of the LPF 122. In more detail, the narrower the bandwidth of the LPF 122, the longer the time response characteristic. The wider the bandwidth of the LPF 122, the shorter the time response characteristic.

However, current high-speed data communication has been established using burst signals. The burst signal requires a short time interval, such that a reception end requires a high-speed gain control operation to perform normal data recovery. If the aforementioned automatic gain control device is contained in a reception end, the bandwidth of the LPF 122 must be increased. However, provided that the bandwidth of the LPF 122 is excessively increased, a noise component unexpectedly occurs, such that a correct magnitude of the output signal S21 cannot be detected, resulting in the creation of an error associated with the gain control signal S22.

Due to the above-described problems, the conventional automatic gain control device has a limitation in increasing the LPF's bandwidth to establish the above high-speed gain control operation, such that it is difficult to acquire a sufficiently-high gain control speed requested by a high-speed data communication system employing burst signals.

Furthermore, the conventional automatic gain control device has been adapted to process analog signals, resulting in a complicated gain control process and a greater error rate.

SUMMARY OF THE INVENTION

Therefore, the present invention has been made in view of the above problems, and it is an object of the present invention to provide an automatic gain control device which performs a high-speed gain control operation, generates a gain code without using a memory or storage device to simplify a system configuration, and establishes a correct gain control operation.

In accordance with the present invention, the above and other objects can be accomplished by the provision of an automatic gain control apparatus for controlling a gain of a variable gain amplifier to enable an output signal of the variable gain amplifier to have a target gain level, comprising: a power detector for calculating a mean power of the output signal of the variable gain amplifier, and converting the calculated mean power into a binary code; a gain code generator for receiving a mean power code from the power detector, and generating a gain code corresponding to the received mean power code; and a voltage generator for receiving the gain code from the gain code generator, calculating a difference between the received gain code and a target gain code associated with the output signal of the variable gain amplifier to detect an error code, and generating a gain control voltage for compensating for the difference between the two gain codes on the basis of the detected error code.

Preferably, the power detector includes: a plurality of multipliers for squaring an input signal to acquire an instantaneous power of either one of the complex input signal and the real-number input signal corresponding to an output signal of the variable gain amplifier; an adder for summing the squared signals received from the multipliers, and generating a power signal associated with either one of the complex input signal and the real-number input signal; a sliding integrator for receiving the power signal from the adder, and calculating an accumulated value of the received power signal during a predetermined symbol interval; and a divider for dividing the output signal of the integrator by a reference symbol time to generate an instantaneous mean power code Preferably, the gain code generator includes: an encoder for receiving a binary value of a mean power value from the power detector, and generating an MSB (Most Significant Bit) position at which a specific value of 1 initially appears; an underflow/overflow detector for comparing the MSB position value from the encoder with minimum/maximum condition values of a gain code, and determining whether underflow or overflow occurs upon receipt of the result of the comparison; a base-level gain code generator for receiving the output value from the encoder and an output signal indicative of generation of either one of underflow and overflow states from the underflow/overflow detector, and generating a base-level gain code corresponding to the generated state information; an offset-level gain code generator for receiving the MSB position value of the mean power code and the output signal indicative of generation of either one of underflow and overflow states, and generating an offset-level gain code corresponding to the generated state information; and an adder for adding the base-level gain code and the offset-level gain code, and generating a gain code corresponding to the mean power detected by the power detector.

Preferably, the gain control voltage generator includes:

a subtracter for subtracting a gain code corresponding to the mean power associated with the output signal of the variable gain amplifier from the target gain code to calculate an error code value; a polarity controller for controlling polarity of the error code value generated from the subtracter according to polarity information associated with a control voltage of the variable gain amplifier; a gain-lock check module for selecting a gain loop constant according to the error code value's magnitude calculated by the subtracter; a DAC (Digital-to-Analog Conversion) code generator for multiplying the gain loop constant selected by the gain-lock check module by a unit-level gain, and generating a DAC code associated with the unit-level gain; an accumulator for multiplying the output error code of the polarity controller by the unit-level DAC code generated from the DAC code generator to calculate a gain compensation code, and accumulating the calculated gain compensation code and a previous compensation value; and a D/A (Digital-to-Analog) converter for converting a gain control code generated from the accumulator into an analog voltage.

Preferably, the base-level gain code generator includes: a first multiplexer for selecting either one of the output signal of the encoder and the base-level gain code generated in the case of underflow upon receiving specific information indicative of the presence or absence of underflow; a second multiplexer for selecting either one of the output signal of the first multiplexer and the base-level gain code generated in the case of overflow upon receiving specific information indicative of the presence or absence of overflow; a subtracter for subtracting the output value of the second multiplexer 222 from a value of a specific position at which a value of 1 is detected from a power bitstream associated with a maximum gain value; and a multiplier for multiplying the output value of the subtracter by the number of gain levels contained between one power and its doubled power, and outputting the multiplied result in the form of a base-level gain code.

Preferably, the offset-level code generator includes: an offset bitstream selector for selecting a plurality of bitstreams equal to the number $N_{offset}$ of offset levels upon receipt of the MSB position value of the encoder's output value; a connector for receiving the bitstreams denoted by "NB Bits" from the offset level selector, and sequentially interconnecting the received bitstreams; a subtracter for receiving the interconnection result value of the bitstreams from the connector, and subtracting the received value from a specific value of $(2^{NL_2}-1)$ (where $NL_2$ is the number of gain levels contained between one power and its doubled power); a third multiplexer for receiving information indicative of the presence or absence of underflow, and selecting either one of the output value of the subtracter and the offset-level value generated in the case of underflow on the basis of the received information; and a fourth multiplexer for receiving information indicative of the presence or absence of overflow, and selecting either one of the offset-level value generated in the case of overflow and the output value of the third multiplexer on the basis of the received information.

Preferably, the underflow/overflow detector includes: a first comparator for comparing an underflow presence condition value with the output value of the encoder, determining if the encoder's output value is indicative of a specific bit position value less than the underflow presence condition value, and generating a signal indicative of the underflow presence when it is determined that the encoder's output value is indicative of the specific bit position value less than the underflow presence condition value; and a second comparator for comparing an overflow presence condition value with the output value of the encoder, determining if the encoder's output value is higher than the overflow presence condition value, and generating a signal indicative of the overflow presence when it is determined that the encoder's output value is higher than the overflow presence condition value.

Preferably, the polarity controller includes: a fifth multiplexer for selecting either one of unit polarity values (+1,−1) according to a polarity control signal corresponding to polarity information of a gain control voltage of the variable gain amplifier; and a multiplier for multiplying the unit polarity value selected by the fifth multiplexer by the error code received from the gain code generator, and determining a gain control direction.

Preferably, the gain-lock check module includes: a plurality of comparators for comparing consecutive error values adapted to divide a gain error generation range at intervals of a predetermined distance with the error code generated from the gain code generator, and generating a plurality of gain loop constant selection signals corresponding to individual ranges.

Preferably, the DAC code generator includes: a unit-level gain DAC code generator for calculating a DAC code associated with a unit-level gain; a selector for selecting a corresponding gain loop constant upon receiving the gain loop constant selection signal from the gain-lock check module; and a multiplier for multiplying a gain loop coefficient selected by the selector by the DAC code generated from the unit-level gain DAC code generator.

Preferably, the unit-level gain DAC code generator calculates a first value denoted by $$G_{dB\,Lstep} = \frac{10 \cdot \log_{10}(2)}{N_{LO}}$$

upon receiving the number $N_{LO}$ of overall gain levels, calculates a second value denoted by $$v_{Lstep} = \frac{10 \cdot \log_{10}(2) - G_c \cdot N_{LO}}{S_G \cdot N_{LO}}$$

to control the first value $$G_{dB\,Lstep} = \frac{10 \cdot \log_{10}(2)}{N_{LO}},$$

and generates a DAC code associated with the second value $$v_{Lstep} = \frac{10 \cdot \log_{10}(2) - G_c \cdot N_{LO}}{S_G \cdot N_{LO}}$$

using a third value denoted by $$C_{dacLstep} = \frac{[10 \cdot \log_{10}(2) - G_c \cdot N_{LO}]}{S_g \cdot N_{LO} \cdot V_{dac\,range}} (2^{N_{dac}} - 1).$$

BRIEF DESCRIPTION OF THE DRAWINGS

The above and other objects, features and other advantages of the present invention will be more clearly understood from the following detailed description taken in conjunction with the accompanying drawings, in which:

FIG. 3 is a table illustrating exemplary operations of the automatic gain control apparatus in accordance with the present invention;

DESCRIPTION OF THE PREFERRED EMBODIMENTS

Figure 1:
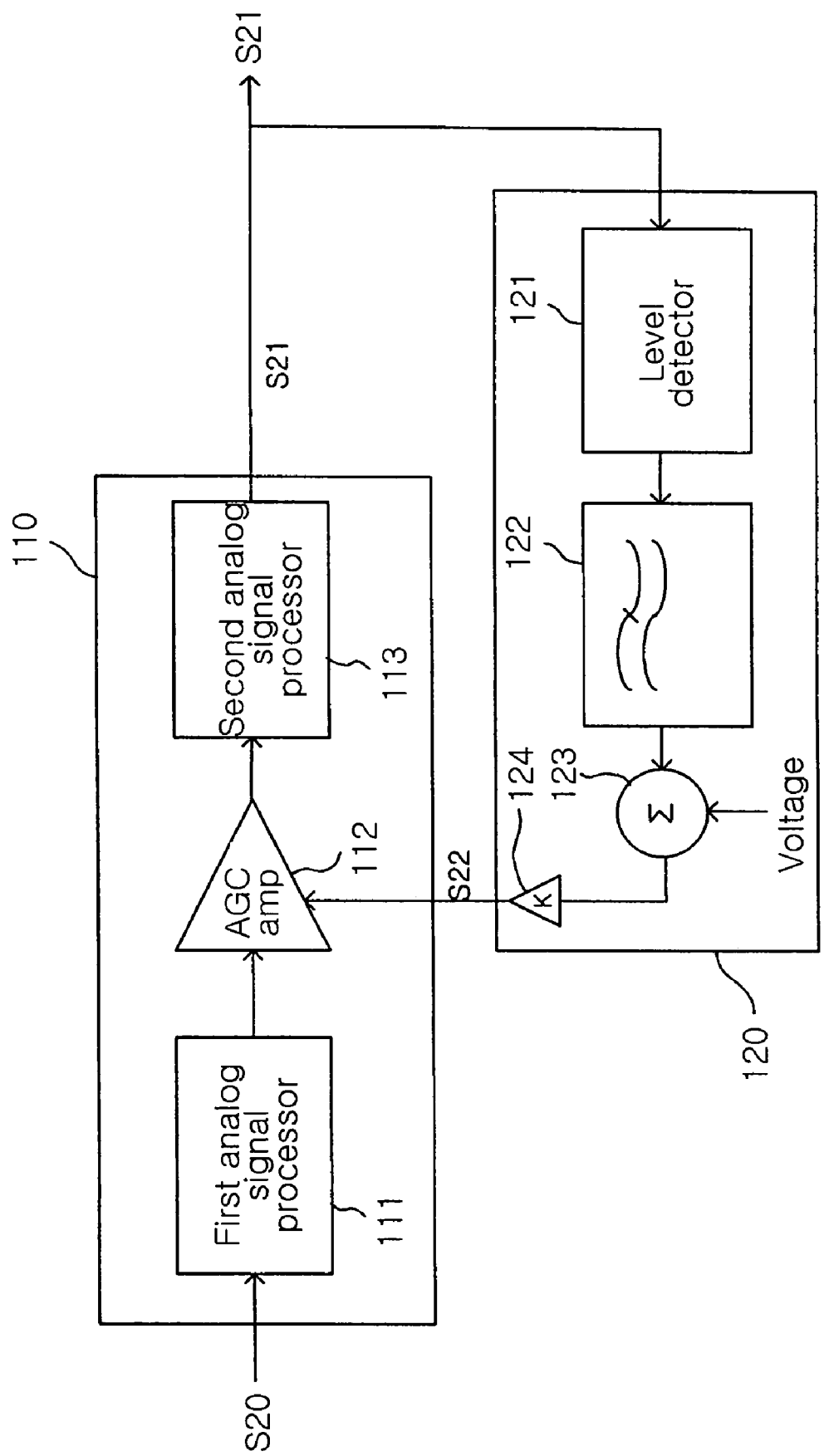
FIG. 1 is a block diagram illustrating a conventional automatic gain control apparatus.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

Operations and detailed configuration of the automatic gain control device of the present invention will hereinafter be described in detail.

Figure 2:
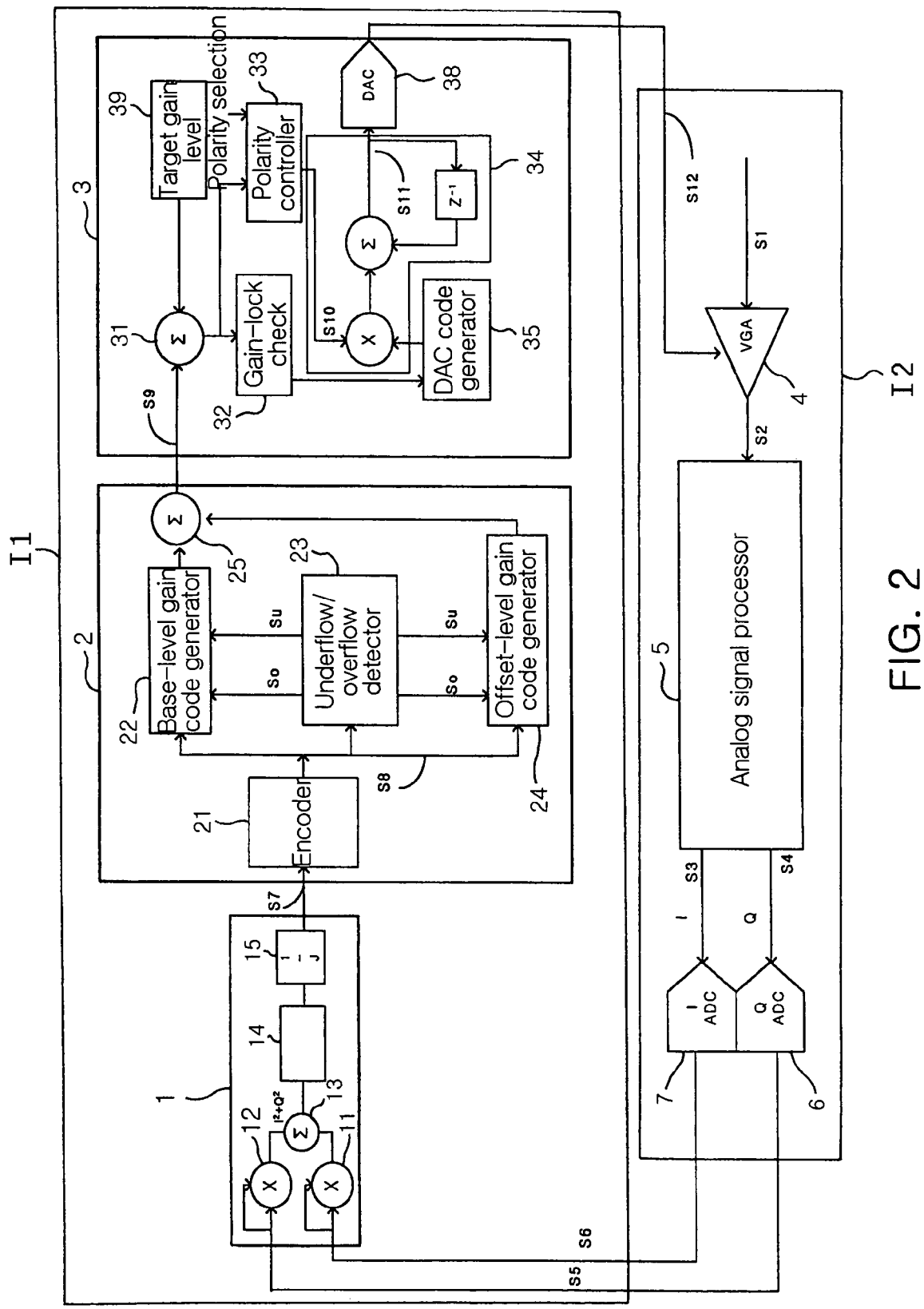
FIG. 2 is a block diagram illustrating an overall configuration of an automatic gain control apparatus in accordance with the present invention.

FIG. 2 is a block diagram illustrating an overall configuration of an automatic gain control apparatus in accordance with the present invention. Referring to FIG. 2, a reference character "I1" is indicative of an automatic gain controller for calculating a necessary gain associated with an input signal S1 received by wire or wirelessly to generate a gain control signal corresponding to the calculated gain. A reference character "I2" is indicative of a control target of the automatic gain control apparatus of the present invention, and acts as an analog signal processor for amplifying the input signal S1 to a signal of a desired magnitude equal to a requested magnitude of either a modem for high-speed data communication or other signal processors upon receiving the gain control signal from the automatic gain controller I1.

The automatic gain controller I1 includes a power detector 1 for calculating two signal data units S5 and S6 generated from the analog signal processor I2 to generate a mean power code; a gain code generator 2 (also called a gain code generation block) for generating a gain code associated with an output signal of a variable gain amplifier 4 upon receiving the mean power code from the power detector 1; and a gain-controlled voltage generator (also called a gain-controlled voltage block) 3 for generating a gain control voltage to control a gain of the variable gain amplifier upon receiving the gain code from the gain code generator 2.

The analog signal processor I2 includes a variable gain amplifier 4 for amplifying the input signal S1 at an amplification rate corresponding to the gain control voltage received from the automatic gain controller I1; an analog signal processor 5 for performing a variety of signal processes, for example, filtering and I/Q demodulation operations of the output signal S2 of the variable gain amplifier 4; and ADCs (Analog-to-Digital Converters) 6 and 7 for converting output signals S3 and S4 of the analog signal processor 5 into digital data S5 and S6.

The input signal S1 applied to the variable gain amplifier 4 of the analog signal processor I2 is amplified by a predetermined gain having been provided before a new gain value is determined, and the amplified signal is applied to the analog signal processor 5. The analog signal processor 5 filters or demodulates the amplified signal. In the present invention, the ADCs 6 and 7 convert the output signals of the analog signal processor 5 into digital data in order to digitally process analog signals.

FIG. 2 shows an exemplary case where the input signal S1 acts as a QAM (Quadrature Amplitude Modulation)—based signal having a multi-level magnitude. In this case, the final output signal of the analog signal processor 5 is a complex signal.

Provided that the input signal is such a complex signal, operations of the automatic gain control apparatus of the present invention will hereinafter be described. If the input signal is equal to the complex signal, the ADC 6 is adapted to process a Q signal of the complex signal, and the ADC 7 is adapted to process an I signal of the complex signal.

I data S5 generated from the ADC 7 is applied to the power detector 1 of the automatic gain controller I1, and Q data S6 generated from the ADC 6 is applied to the power detector 1 of the automatic gain controller I1.

The mean power unit 1 controls a first multiplier 11 to square the I signal S5 of the complex signal, and controls a second multiplier 12 to square the Q signal S6 of the complex signal. Individual squared results of the I and Q signals are applied to an adder 13. The adder 13 sums the squared results received from the multipliers 11 and 12 to calculate a power value associated with the input signal. In this case, the output signal of the adder 13 is denoted by $I^2+Q^2$.

A sliding integrator 14 calculates an accumulated value of the complex power during a prescribed time. A divider 15 divides the accumulated value by a symbol interval to calculate a mean value of the accumulated value.

Therefore, the output signal of the power detector 1 can be represented by the following Equation 1:

$$P_n = \frac{1}{J}\sum_{n=0}^{J-1}(I_n^2+Q_n^2) \quad \text{[Equation 1]}$$

where $P_n$ is a mean power during a symbol time J of a corresponding observation interval, and $I_n$ and $Q_n$ are quadrature component values of the complex input signal generated from the analog signal processor I2, respectively.

The mean power signal S7 generated from the power detector 1 is applied to the gain code generator 2. The gain code generator 2 is adapted to generate a code value corresponding to a mean power value, and controls an encoder 21 to recognize an MSB (Most Significant Bit) position at which a specific value of 1 initially appears upon receipt of a binary value of the received mean power. A base-level gain code generator 22 receives the MSB position from the encoder 21, and detects a base level of a gain associated with an output signal of the analog signal processor I2, such that it generates a gain code corresponding to the detected base level.

Simultaneously, an offset-level gain code generator 24 receives the MSB position from the encoder 21 to generate a gain code associated with a prescribed offset-level.

Furthermore, the underflow/overflow detector 23 compares the MSB position received from the encoder 21 with a reference value to determine if underflow or overflow has been generated.

An adder 25 sums up the base-level gain code and the offset-level gain code, so that the summed result is generated in the form of a gain code corresponding to the magnitude of an output signal of the analog signal processor I2.

Exemplary operations of the gain code generator 2 will hereinafter be described. The input signal is equal to an analog-to-digital conversion signal composed of 10 bits. It is assumed that an observation interval having been determined during a mean power calculation time of the mean detector 1 is composed of 16 symbol intervals. Provided that an input voltage operation range of the ADCs 6 and 7 is determined to be a predetermined value of −600 mV ~600 mV, the lowest step voltage is equal to 1.2/1024 =1.17 mV. In this case, provided that the mean power of the analog-to-digital (A/D) conversion signal composed of 10 bits is converted into a binary value, it can be displayed in the form of a value of 20 bits.

Under the aforementioned assumption, FIG. 3 exemplarily shows A/D conversion signal composed of 10 bits, mean powers and gain levels of the power detector 1 corresponding to the A/D conversion signal. Referring to FIG. 3, the input voltage ① is a voltage applied to the ADCs 6 and 7, the ADC output signal ② is created by reconstructing the output values of the ADCs 6 and 7 corresponding to the input voltage ① in the form of a decimal value equivalent to an analog-to-digital conversion binary code. The power ③ is indicative of a square value of the ADC output signal ②. The binary code ④ is created by reconstructing the power ③ in the form of a binary value. The AGC gain level ⑤ is a gain level acquired from the corresponding power ③. The control gain ⑥ is indicative of a control gain value corresponding to each input voltage ① on the condition that a target level has been set to a prescribed value of 100 mVrms. In this case, the gain control range is almost in the range from 38.859−(−8.06) dB to 42 dB.

Therefore, if the input voltage ① is determined to be 1.17 mVrms, the control gain ⑥ is determined to be 38.859 dB, so that there is a need for the input voltage ① to be amplified by the determined value of 38.859 dB. If the input voltage ① is determined to be 251.19 mVrms, there is a need for the input voltage ① to be reduced by 8.06 dB.

Whenever the value of the binary code ④ is increased two fold (i.e., is equal to double the binary code ④), namely, whenever the power value of the input voltage ① is doubled, the AGC gain level ⑤ must be determined by the number of levels indicative of the division result value of a minimum gain value to be controlled, and the aforementioned determination process can be represented by the following Equation 2:

$$NL_2 = 2^{ceil\left(\log_2\left(\frac{10\cdot\log_{10}(2)}{G_{step\,min}}\right)\right)} \quad \text{[Equation 2]}$$

where $NL_2$ is the number of gain levels contained in the doubled power, $G_{step\,min}$ is a minimum gain value. For example, if a gain step to be controlled is set to 0.752575 dB, the number of gain levels is 4. This means that the number of gain levels is increased by 4 when the doubled power is provided. In this way, in the case of determining the number of gain levels on the condition that the doubled power has been provided using the minimum gain value as a unit, a system user or operator can easily calculate the number of gain levels. Therefore, in the case of determining the number of gain levels using only the memory, there is no need for a large number of memories to be used. Using the aforementioned method, the number of gain levels is increased by a predetermined value whenever the power is doubled. Therefore, provided that a bitstream is determined to be $\vec{z}=[z_n, z_{n-1}, \ldots z_0, b_{-1}\ldots, b_{-m}]$ on the condition that a bit indicative of $N_B=\log_2(NL_2)$ is added to a binary bitstream of the power. In this case, the reference character $NL_2$ is the number of gain levels between one power and its doubled power. The number of gain levels can be represented by the following Equation 3:

$$N_{GL}=NL_2\cdot(P_{g\,max}-P_{msb\_position})+N_{offset} \quad \text{[Equation 3]}$$

where $N_{GL}$ is the number of gain levels, $NL_2$ is the number of gain levels between one power and its doubled power, $P_{g\_max}$ is a position of a power bitstream associated with a maximum gain value, $P_{msb\_position}$ is an MSB position of the input power bitstream, and $N_{offset}$ is the number of offset levels.

In the case of selecting a low-order bit $N_B = \log_2(NL_2)$ of a bit at which $P_{msb\_position}$ appears from among a bitstream $\vec{z}$, and subtracting a decimal value of the selected bitstream from a prescribed value $(2^{NL_2}-1)$), the resultant value is the same as the number of offset levels $N_{offset}$. For example, if $NL_2$ is determined to be 4, the number of offset levels $N_{offset}$ can be represented by the following Equation 4:

$$N_{offset} = \begin{cases} 0, & \text{bit pattern} = \text{'11'} \\ 1, & \text{bit pattern} = \text{'10'} \\ 2, & \text{bit pattern} = \text{'01'} \\ 3, & \text{bit pattern} = \text{'00'} \end{cases} \quad [\text{Equation 4}]$$

For example, provided that the bitstream of a mean power generated from the power detector 1 is set to "0000011011101100110001", and the number of gain levels between one power and its doubled power is set to $NL_2=4$, the bitstream $\vec{z} = [z_n, z_{n-1}, \ldots, z_0, b_{-1} \ldots, b_{-m}]$ is set to "00000110111011001100001000". As shown in FIG. 3, the maximum gain control position (i.e., an MSB position at which overflow is generated) is set to 15, and the MSB position of the mean power bitstream is set to 13. The number of offset levels is equal to "3−2=1". Therefore, the number of generated gain levels is equal to "4(15−13)+1=9" using the above Equation 3.

Based on the aforementioned principles, a detailed description of the gain code generator 2 will hereinafter be described.

The gain code generator 2 controls the encoder 21 to search for a specific position at which a specific value of 1 initially appears in the bitstream having a mean power value. Upon receiving the detected position information from the encoder 21, the base-level code generator 22 generates a code value having a base level, and the offset-level code generator 23 generates a code value having an offset level.

Figure 4:
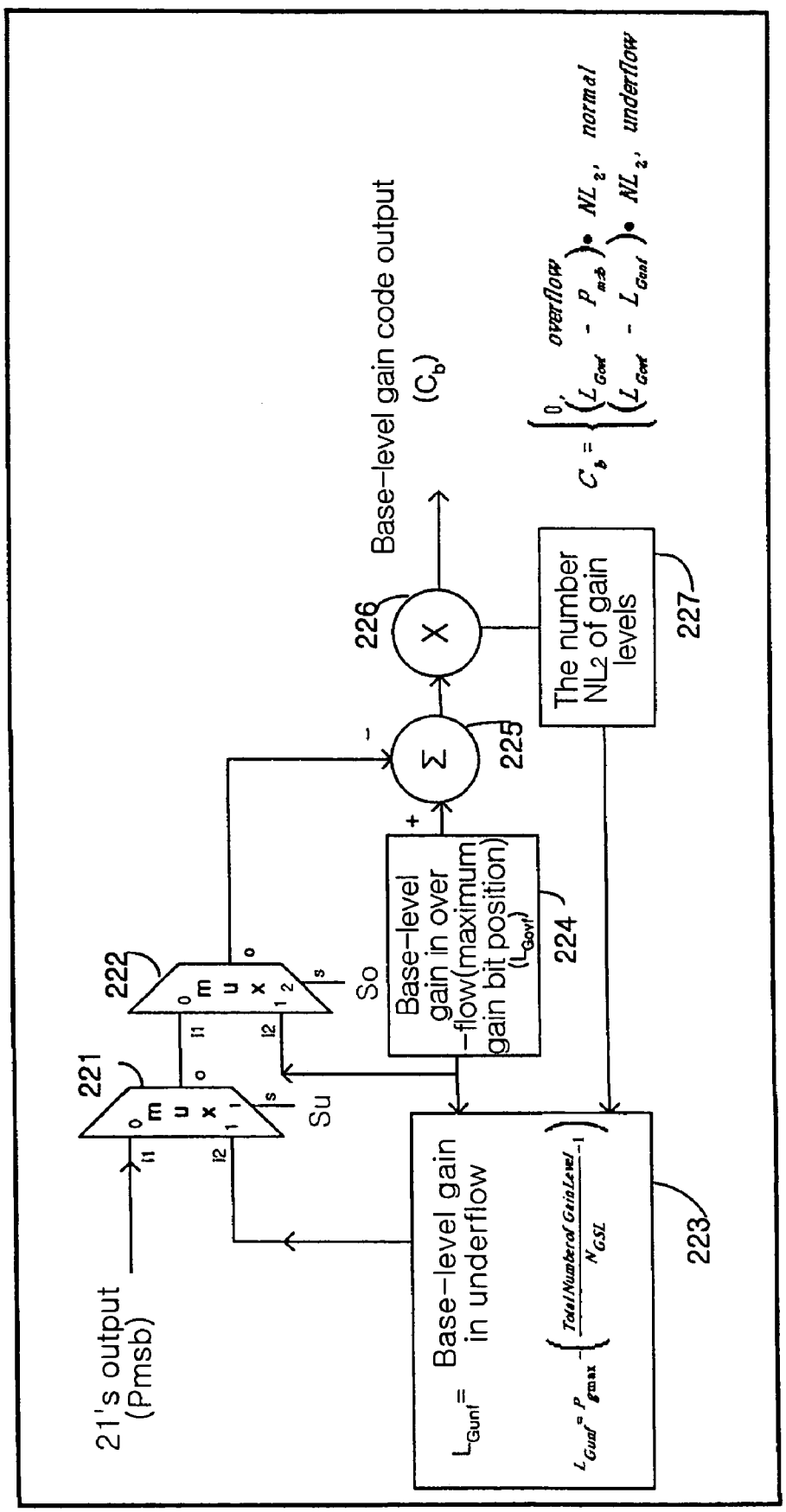
FIG. 4 is a detailed block diagram illustrating a base level gain code generator for use in the automatic gain control apparatus in accordance with the present invention.

The base-level code generator 22 is shown in FIG. 4. Referring to FIG. 4, the base-level code generator 22 includes a first multiplexer 221, a second multiplexer 222, a subtracter 225, and a multiplier 226. The first multiplexer 221 selects either an output signal of the encoder 21 or the base-level gain code value 223 generated in the case of underflow upon receiving specific information indicative of the presence or absence of underflow. The second multiplexer 222 selects either an output signal of the first multiplexer 221 or a base-level gain code value 224 indicative of the presence of overflow. The subtracter 225 subtracts the output value of the second multiplexer 222 from the base-level gain code value 224 indicative of a specific position at which the value of 1 is detected from a power bitstream associated with a maximum gain value. The multiplier 226 multiplies the output value of the subtracter 225 by the number of gain levels contained between one power and its doubled power.

The aforementioned base-level gain code generator 22 calculates a value of a first right term contained in the above Equation 3. In this case, the condition of underflow or overflow indicates a specific case where a gain control range of the automatic gain control apparatus is outside of a prescribed range from a minimally-controlled gain value to a maximally-controlled gain value.

Figure 5:
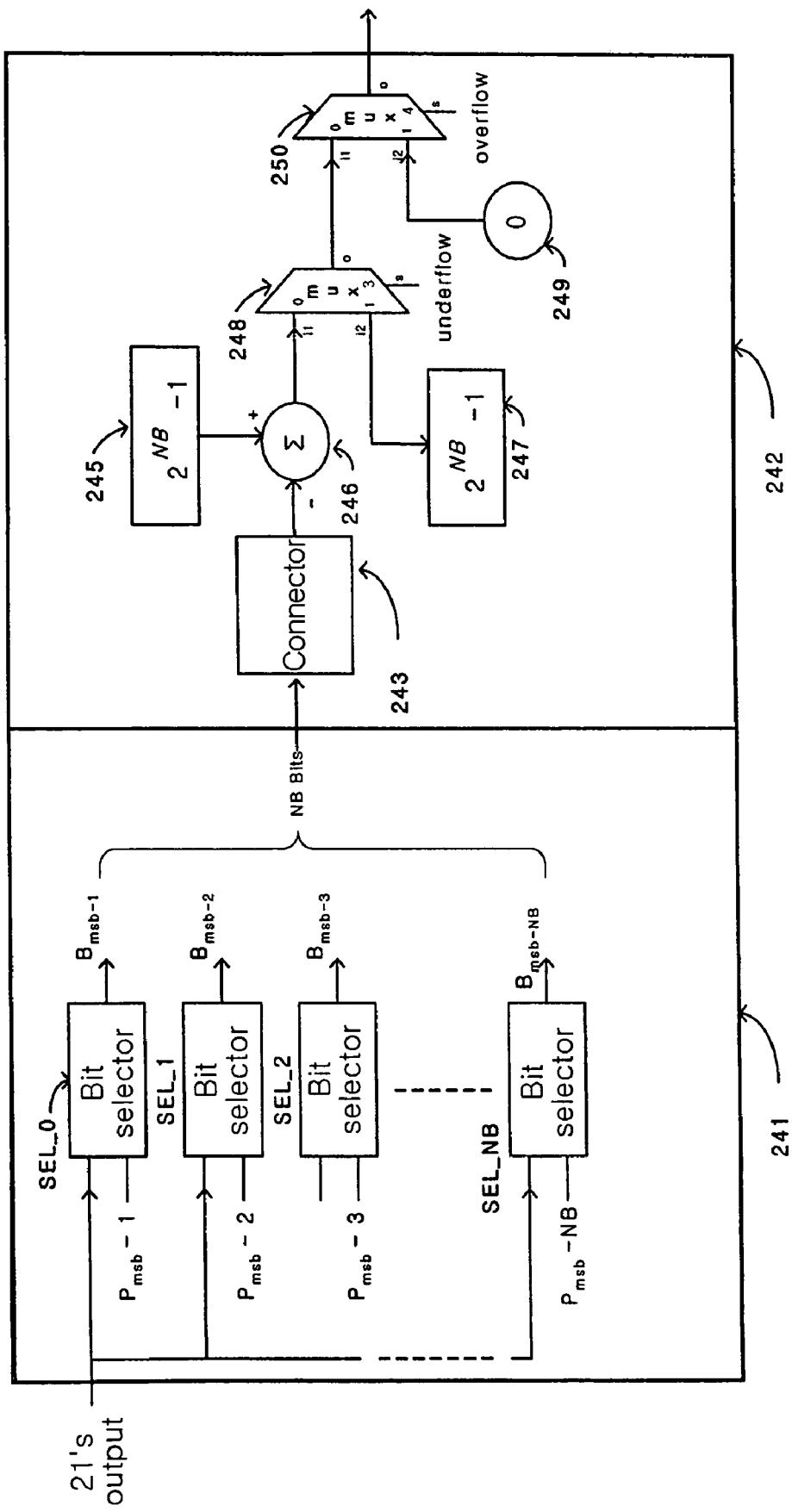
FIG. 5 is a detailed block diagram illustrating an offset level gain code generator for use in the automatic gain control apparatus in accordance with the present invention.

FIG. 5 is a detailed block diagram illustrating an offset level gain code generator 24 for generating information indicative of the number of offset-level codes. Referring to FIG. 5, the offset-level gain code generator 24 includes an offset bitstream selector 241, and an offset-level corrector 242. The offset bitstream selector 241 selects a plurality of bitstreams as many as the number $N_{offset}$ of offset levels, on the basis of an MSB position value of the encoder 21's output value. The offset level corrector 242 receives the selected bitstream from the offset bitstream selector 241, and corrects the offset level on the basis of the presence or absence of overflow.

The offset level corrector 242 includes a connector 243, a subtracter 246, a third multiplexer 248, and a fourth multiplexer 250. The connector 243 receives the bitstreams denoted by "NB Bits" from the offset level selector 241, and sequentially interconnects the received bitstreams. The subtracter 246 receives the interconnection result value of the bitstreams from the connector 243, and subtracts the received value from the value 245 of $(2^{NL_2}-1)$. Upon receipt of information indicative of the presence or absence of underflow, the third multiplexer 248 selects either the output value of the subtracter 246 or the offset-level value 247 generated in the case of underflow. Upon receipt of other information indicative of the presence or absence of overflow, the fourth multiplexer 250 selects either the offset-level value (i.e., 0) 249 generated in the case of overflow or the output value of the third multiplexer 248.

Due to the aforementioned configuration, the offset-level gain code generator 24 can calculate an offset-level corresponding to a voltage level.

Figure 6:
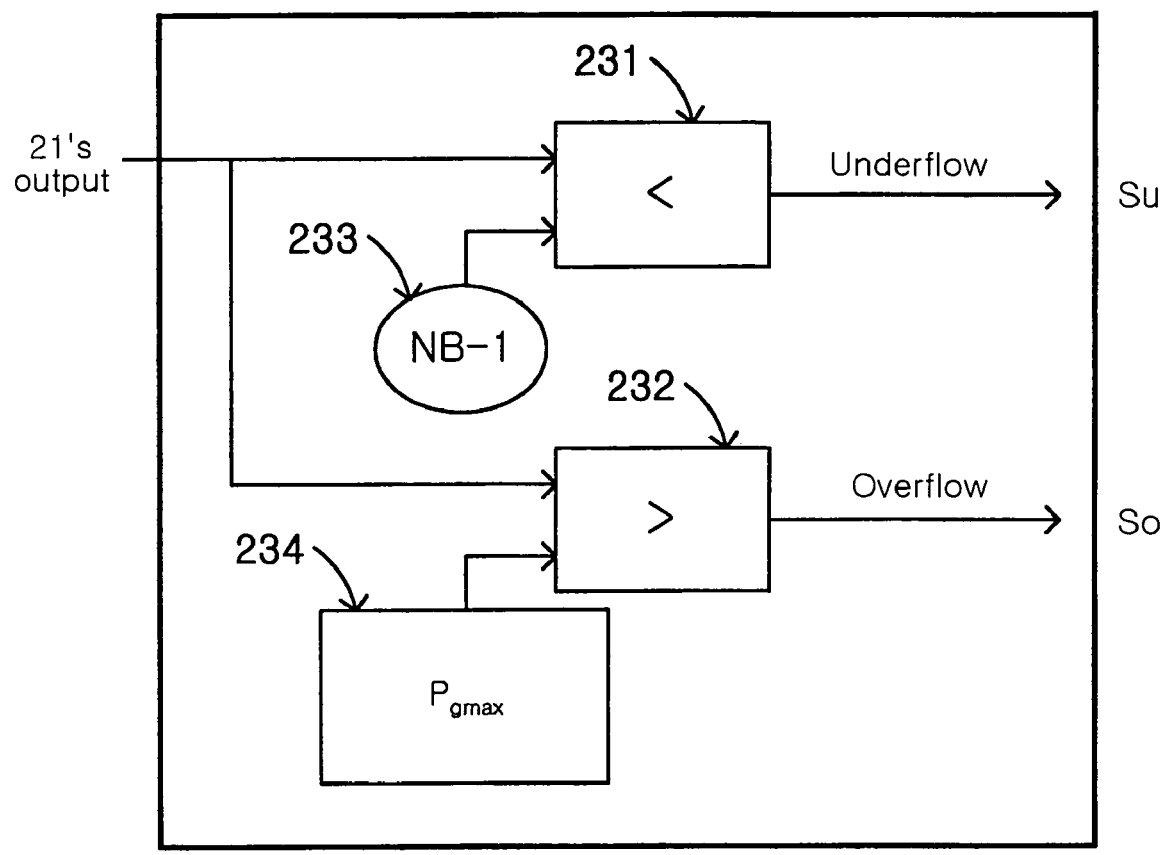
FIG. 6 is a detailed block diagram illustrating an underflow/overflow detector for use in the automatic gain control apparatus in accordance with the present invention.

The overflow/underflow detector 23 determines if the output voltage of the analog signal processor I1 is outside of the prescribed range from a minimally-controlled gain range to the maximally-controlled gain range. Referring to FIG. 6, the overflow/underflow detector 23 includes a first comparator 231 and a second comparator 232. The first comparator 231 compares an underflow presence condition value 233 with an output value of the encoder 21 to determine if the encoder 21's output value is indicative of a specific bit position value less than the underflow presence condition value 233, and informs a user or operator of the presence of underflow on the condition that it is determined that the encoder 21's output value is indicative of a specific bit position value less than the underflow presence condition value 233. The second comparator 232 compares an overflow presence condition value 234 with the output value of the encoder 21 to determine if the encoder 21's output value is higher than the overflow presence condition value 234, and informs a user or operator of the presence of overflow on the condition that it is determined that the encoder 21's output value is higher than the overflow presence condition value 234.

The aforementioned gain code generator 2 is adapted to generate a code corresponding to a gain level using the above Equation 3. If the output gain level of the gain code generator 2 is classified according to specific information indicative of the presence or absence of the overflow/underflow states, the classified result can be represented by the following Equation 5:

$$N_{GL} = \begin{cases} 0, & \text{overflow} \\ (L_{Govf} - P_{msb}) \cdot NL_2 + N_{offset}, & \text{normal} \\ (L_{Govf} - L_{Gunf}) \cdot NL_2 + (2^{NL2} - 1), & \text{underflow} \end{cases} \quad \text{[Equation 5]}$$

As shown in the above result of Equation 5 using the adder 24 for adding the output signal of the base-level gain code generator 22 and the output signal of the offset-level gain code generator 24, the gain code generator 2 generates a gain code value corresponding to a mean power detected by the power detector 1.

Figure 7:
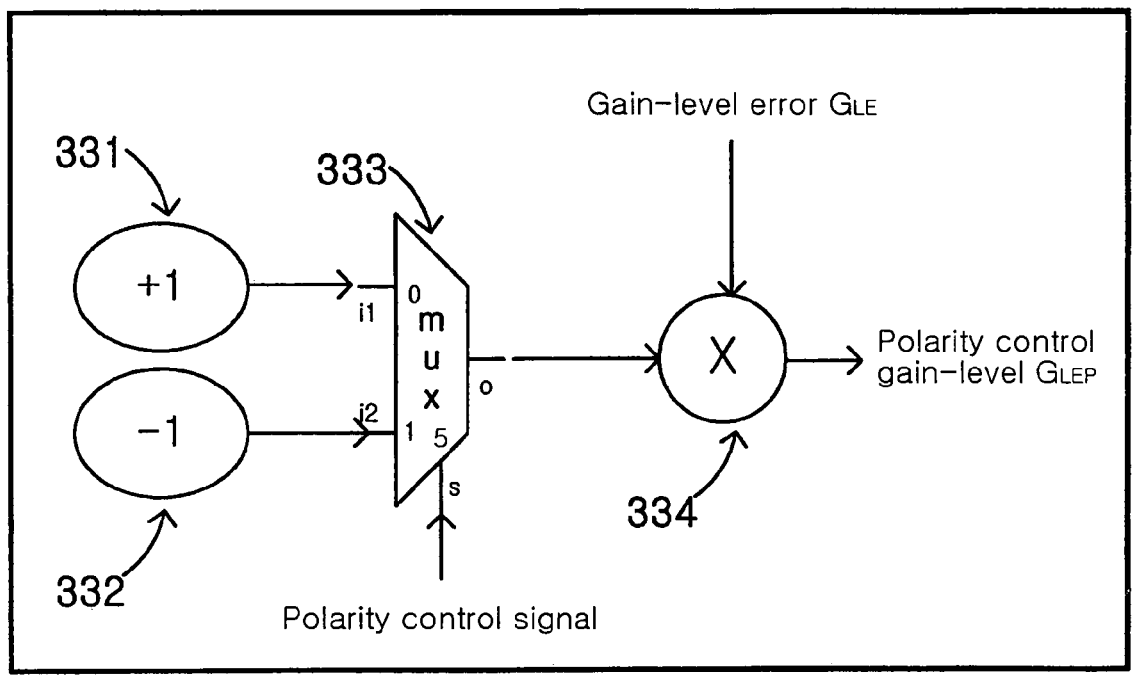
FIG. 7 is a detailed block diagram illustrating a polarity controller for use in the automatic gain control apparatus in accordance with the present invention.

The automatic gain controller 3 receives a difference between the generated gain code value and a target gain code value from the gain code generator 2, and determines a value of a gain to be established in association with a current mean power on the basis of the received difference. The automatic gain controller 3 controls the subtracter 31 to calculate a difference between a gain code value corresponding to a current mean power level generated from the gain code generator 2 and a target gain code value 39 such that the subtracter 31 can acquire an error code value. The acquired error code value is transmitted to the polarity controller 33. Referring to FIG. 7, the polarity controller 33 includes a fifth multiplexer 333 for selecting either one of polarities (+,−) of a control voltage associated with the variable gain amplifier 4 according to a polarity control signal value, and a multiplier 334 for multiplying a value of the polarity selected by the fifth multiplexer 333 by the error code value received from the subtracter 31, such that it can control the polarity of the error code value according to the polarity control signal.

Figure 8:
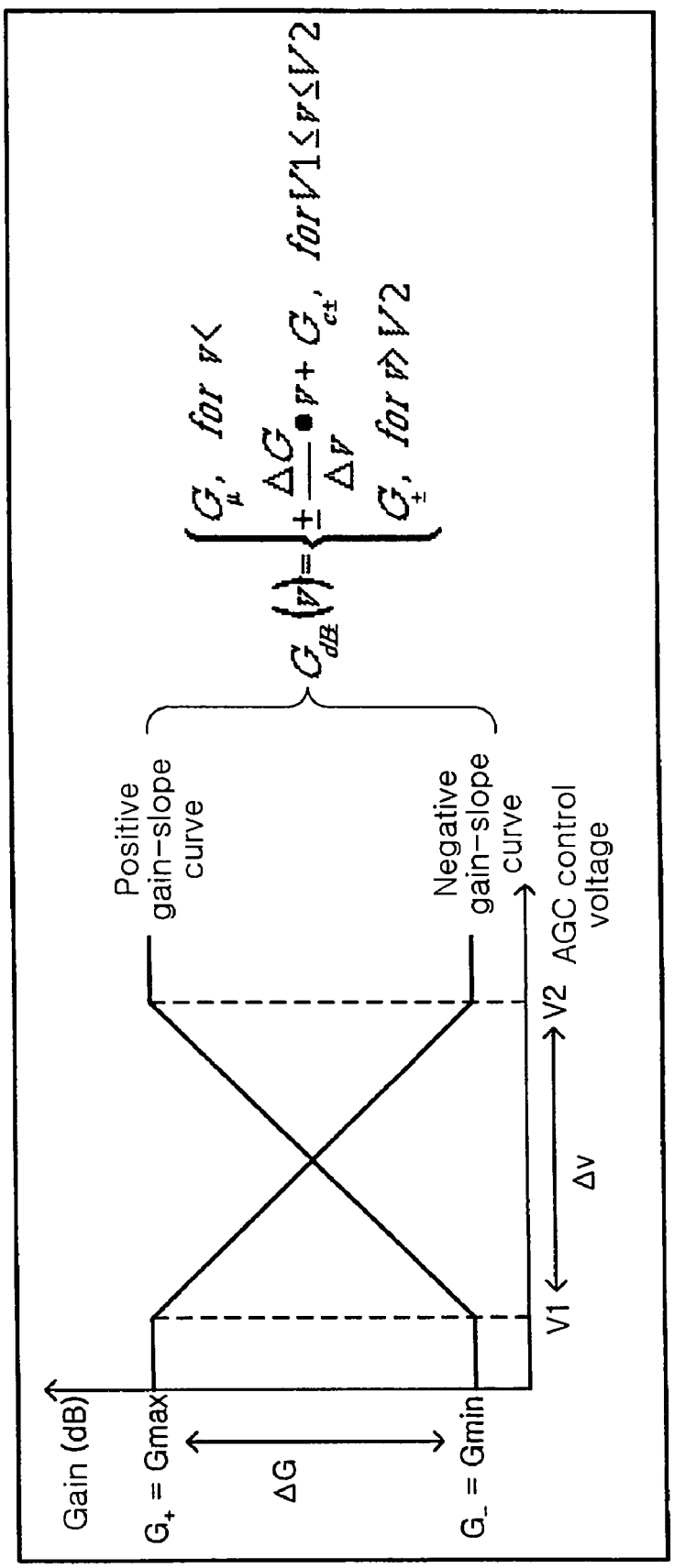
FIG. 8 is a graph illustrating a compensation gain curve varying with a gain control voltage of a variable gain amplifier for use in the automatic gain control apparatus in accordance with the present invention.

The reason why the polarity controller 33 controls the polarity of the error code value is that a gain control voltage of the variable gain amplifier 4 contained in the analog signal processor 12 is composed of a "positive gain-slope curve" having a positive(+) slope for increasing a gain in proportion to a voltage and a "negative gain-slope curve" having a negative(−) slope for reducing the gain in proportion to the voltage, as shown in FIG. 8. The polarity controller 33 must change the polarity of an error code value on the basis of polarity information of the gain control voltage of a corresponding variable gain amplifier 4. The gain variation characteristic in response to the gain control voltage as shown in the graph of FIG. 8 can be represented by the following Equation 6:

$$G_{dB}(V) = \begin{cases} G_\mu, & \text{for } v < \\ \pm \dfrac{\Delta G}{\Delta v} \cdot v + G_{c\pm}, & \text{for } V1 \le v \le V2 \\ G_\pm, & \text{for } v > V2 \end{cases} \quad \text{[Equation 6]}$$

The error code value S10 generated from the polarity controller 33 is multiplied by an output signal of a unit-level DAC code generator 35 for converting a unit-level gain into a code value to be DA(Digital-to Analog)-converted.

The unit-level DAC code generator 35 is adapted to generate a gain loop constant (also called a gain loop coefficient), and controls a value of the gain loop constant such that it can vary a gain control time. In more detail, a burst signal for use in high-speed data communication requires a high-speed gain control operation. If the unit-level DAC code generator 35 sets the gain loop constant to a high value in the case of a high error code value, it can perform the high-speed gain control operation.

The automatic gain control device of the present invention uses a gain loop-constant of a high value because a high error code value is generated at an initial input time of a burst signal, or uses a gain loop constant of a low value when an error code value is contained in a prescribed error range, such that it can finely perform a gain control operation.

Figure 10:
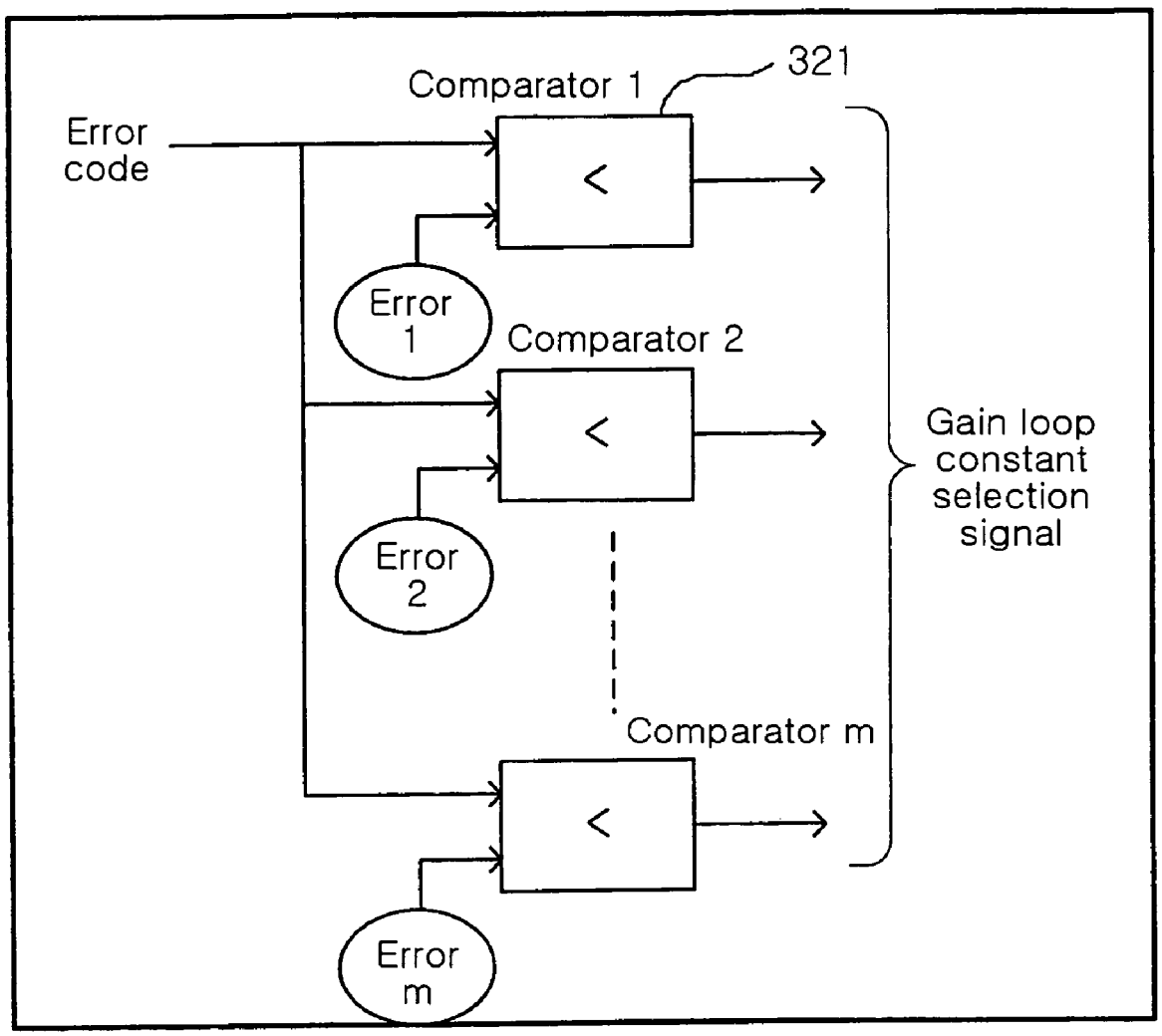
FIG. 10 is a detailed block diagram illustrating a gain-lock check module for use in the automatic gain control apparatus in accordance with the present invention.

The aforementioned setup operation of the gain loop constant is determined by a gain-lock check module 32. Referring to FIG. 10, the gain-lock check module 32 includes a plurality of comparators 321 for comparing an error code value calculated by the subtracter 31 with individual error values to check the range of the error code value, resulting in a gain loop constant selection signal. The gain-lock check module 32 determines which one of the magnitudes of the error code value is provided, and reports the determined result to the unit-level DAC code generator 35.

The unit-level DAC code generator 35 generates a DAC code value associated with a gain loop constant corresponding to the checked range of the gain-lock check module 32.

Figure 9:
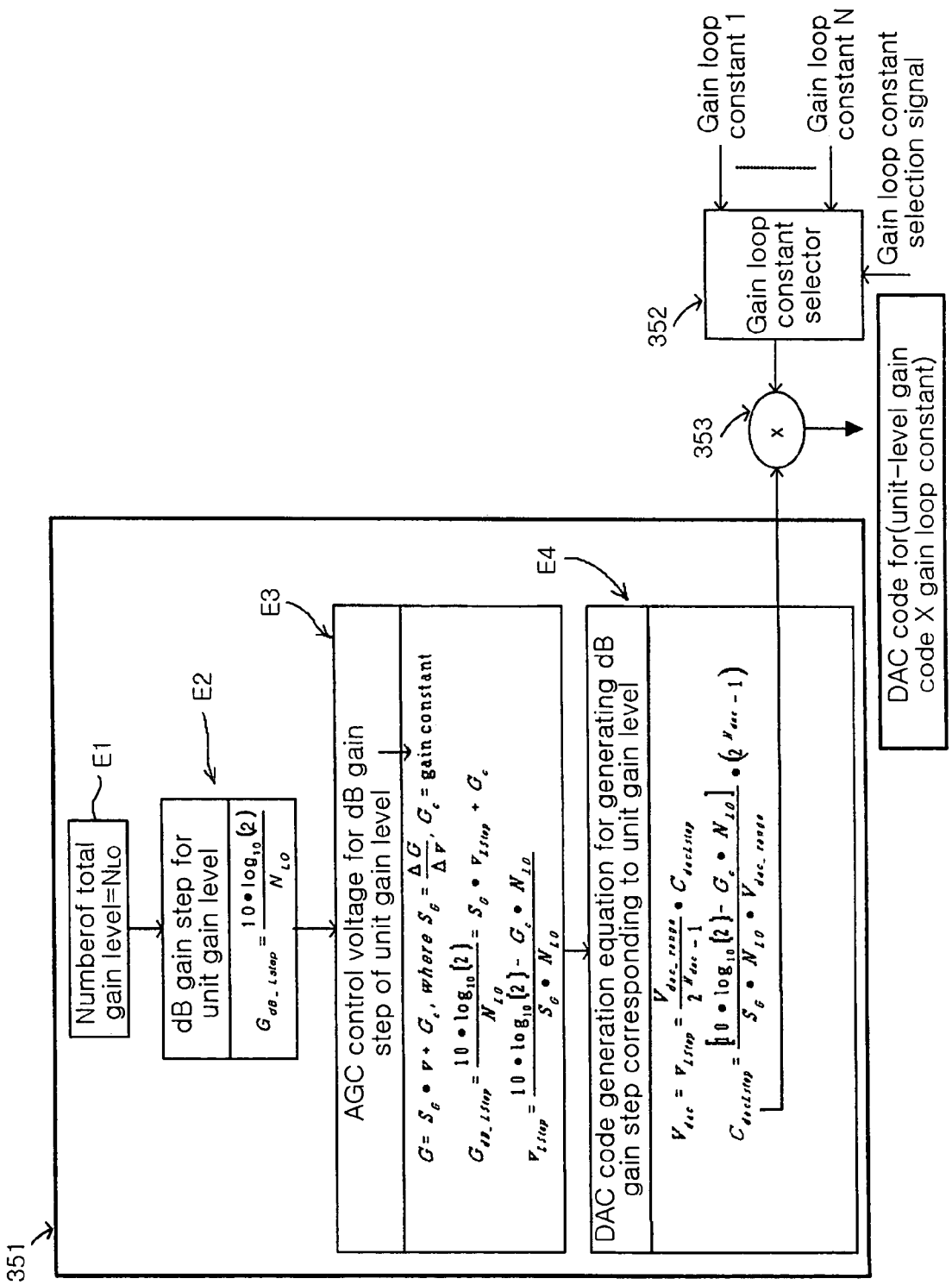
FIG. 9 is a view illustrating a detailed circuit diagram of a DAC code generator and operations thereof for use in the automatic gain control apparatus in accordance with the present invention.

FIG. 9 is a view illustrating a detailed circuit diagram of the unit-level DAC code generator 35 and its operations. The unit-level DAC code generator 35 includes a unit-level gain code generator 35 includes a unit-level gain code generation module 351 for generating a gain code value in response to a unit control voltage; a gain loop constant selector 352 for selecting a gain loop constant contained in a corresponding range upon receiving the gain loop constant selection signal from the gain-lock check module 32; and a multiplier 353 for multiplying the gain code associated with the unit voltage having been received from the unit-level gain code generator 35 by the gain loop constant having been selected by the gain loop constant selector 352, and generating a DAC code required for a corresponding error code value.

Detailed operations of the unit-level DAC code generator 35 will hereinafter be described with reference to FIG. 9. The unit-level gain code generator 351 firstly determines the number $N_{LO}$ of overall gain levels at step E1, and calculates a unit gain value $G_{dB\ Lstep}$ associated with a unit level on the basis of the number $N_{LO}$ of overall gain levels at step E2. In this case, the unit gain value $G_{dB\ Lstep}$ can be calculated using the following Equation 7:

$$G_{dB\ Lstep} = \frac{10 \cdot \log_{10}(2)}{N_{LO}} \quad \text{[Equation 7]}$$

Upon acquiring the unit gain value $G_{dB\ Lstep}$ using Equation 7, the unit-level gain code generator 351 calculates a gain control voltage in response to a corresponding unit gain level varying with the gain control voltage characteristic curve shown in FIG. 8 at step E3. The gain control voltage in response to the unit gain level can be calculated using the following Equation 8:

$$G = S_G \cdot v + G_c, \text{ where } S_G = \frac{\Delta G}{\Delta v},\ G_c = \text{constant} \quad \text{[Equation 8]}$$

$$G_{dB\ Lstep} = \frac{10 \cdot \log_{10}(2)}{N_{LO}} = S_G \cdot v_{Lstep} + G_c$$

$$v_{Lstep} = \frac{10 \cdot \log_{10}(2) - G_c \cdot N_{LO}}{S_G \cdot N_{LO}}$$

where $S_G$ is a slope of a gain associated with a control voltage, and $v_{Lstep}$ is a unit control voltage corresponding to a unit gain level.

Upon receipt of the unit control voltage $v_{Lstep}$, the unit-level gain code generator 351 acquires a DAC code capable of generating the received unit control voltage $v_{Lstep}$ at step E4. The DAC code value can be calculated using the following Equation 9 for generating a voltage of a DAC (Digital-to-Analog Converter):

$$V_{dac} = V_{Lstep} = \frac{V_{dac\_range}}{2^{N_{dac}} - 1} \cdot C_{dac\,Lstep} \quad [\text{Equation 9}]$$

$$C_{dac\,Lstep} = \frac{[10 \cdot \log_{10}(2) - G_c \cdot N_{LO}]}{S_g \cdot N_{LO} \cdot V_{dac\,range}} (2^{N_{dac}} - 1)$$

where $V_{dac\_range}$ is the range of an output voltage of the DAC, and $C_{dacLstep}$ is a unit-level DAC code for generating a dB gain step corresponding to a unit gain level.

In this way, the unit-level DAC code value calculated by the unit-level gain code generator 351 can provide a control voltage associated with a unit level. The multiplier 351 multiplies the gain constant having been selected by the gain loop constant selector 352 upon receiving the gain loop constant selection signal from the gain-lock check module 32 by the unit-level DAC code value, resulting in a gain loop constant corresponding to the range of the corresponding error code value.

The DAC control voltage code generated from the DAC code generator 35 is transmitted to an accumulator 34, and at the same time a predetermined error code value having a polarity determined by the polarity controller 33 is also transmitted to the accumulator 34. The accumulator 34 includes a memory for storing a previous gain compensation value; a multiplier for multiplying a DAC code value corresponding to the gain loop constant generated from the DAC code generator 35 by a current error code; and an adder for adding a previous value stored in the memory to the output value of the multiplier to provide an accumulated gain compensation value. Therefore, the accumulator 34 adds a compensation component associated with the calculated error code value to the pre-calculated control voltage code, and transmits the added result to the DAC 38. The DAC 38 converts the compensated gain control voltage code into an analog voltage signal, and transmits the converted result to the variable gain amplifier 4. Therefore, the variable gain amplifier 4 can control an amplification rate in the direction of compensating a gain error so that it amplifies the next input signal S1 to have the compensated gain.

Figure 11:
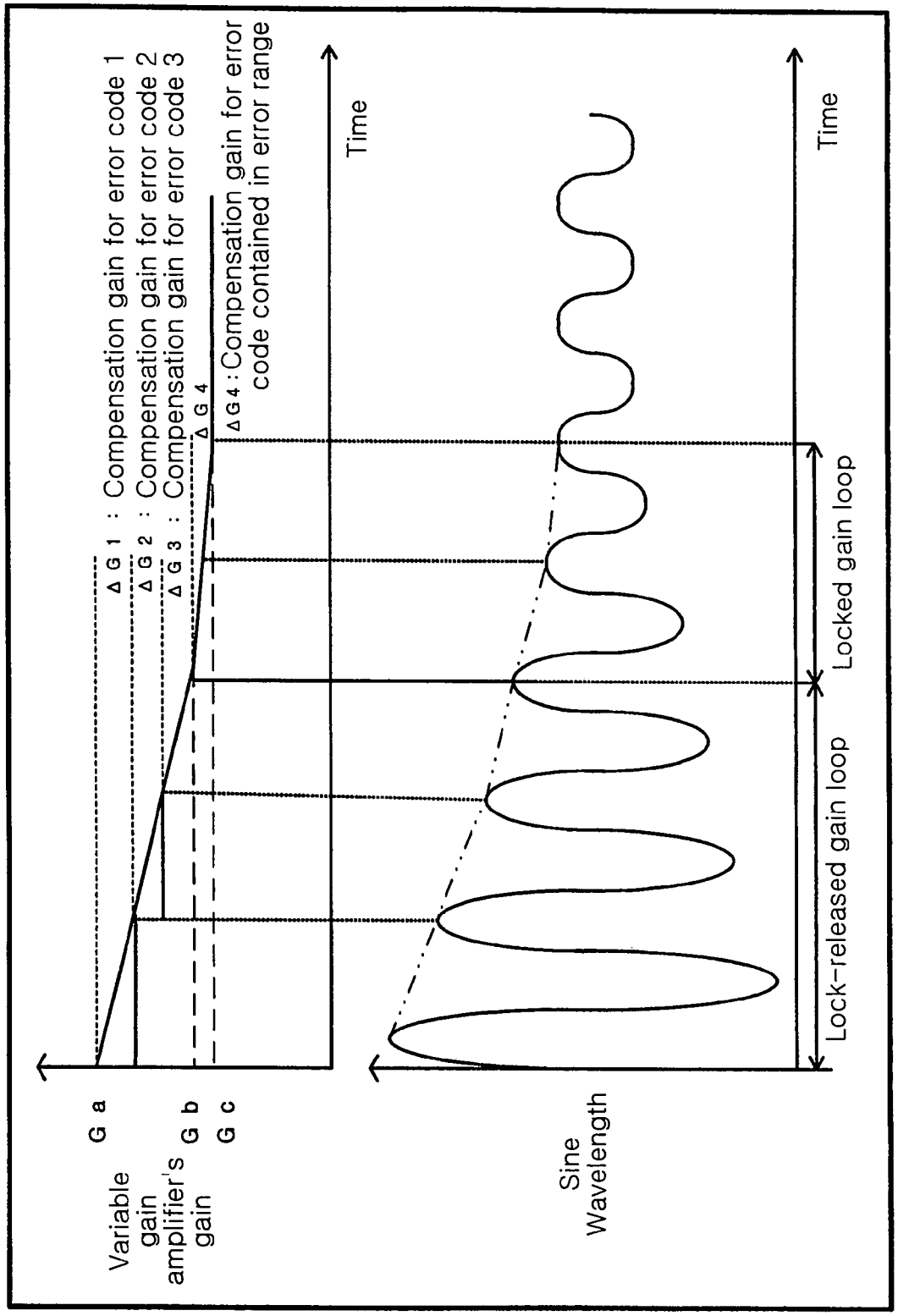
FIG. 11 is a graph illustrating an exemplary gain control compensation method for sinusoidal waves (i.e., sine waves) for use in the automatic gain control apparatus in accordance with the present invention.

FIG. 11 is a graph illustrating an exemplary gain control compensation method for sinusoidal waves (i.e., sine waves) for use in the automatic gain control apparatus in accordance with the present invention. Referring to FIG. 11, if an initial error code value of the sinusoidal signal is higher than a prescribed error range needed for a gain check operation, the gain-lock check module 32 selects a high gain loop constant to increase a compensation gain, such that the automatic gain control device of the present invention can provide an error code of the error range during a short time. If the error code is contained in the error range, the automatic gain control device selects a gain loop constant of a low value, resulting in the implementation of a fine gain control operation.

As apparent from the above description, the automatic gain control device of the present performs a gain control operation at a high speed, generates a control gain value on the basis of a mean power value using only a logical calculation method instead of using a memory or a lookup table, such that it does not rely on a binary value of an input power signal.

Therefore, the automatic gain control device need not change the memory or the lookup table even though a reception system is changed to another system, and can increase compatibility or reuse efficiency. Furthermore, if a gain difference is contained in a prescribed error range, the automatic gain control device controls a gain control constant to be a low value, resulting in a correct gain control operation and a simplified configuration.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An automatic gain control apparatus for controlling a gain of a variable gain amplifier to enable an output signal of the variable gain amplifier to have a target gain level, comprising:
    a power detector for calculating a mean power of the output signal of the variable gain amplifier, and converting the calculated mean power into a binary code;
    a gain code generator for receiving a mean power code from the power detector, and generating a gain code corresponding to the received mean power code; and
    a voltage generator for receiving the gain code from the gain code generator, calculating a difference between the received gain code and a target gain code associated with the output signal of the variable gain amplifier to detect an error code, and generating a gain control voltage for compensating for the difference between the two gain codes on the basis of the detected error code,
    wherein the gain code generator includes:
    an encoder for receiving a binary value of a mean power value from the power detector, and generating an MSB (Most Significant Bit) position at which a specific value of 1 initially appears;
    an underflow/overflow detector for receiving an output value from the encoder, and determining whether the output value of the corresponding variable gain amplifier is outside of a prescribed range between a minimum gain level to a maximum gain level;
    a base-level gain code generator for receiving the output value from the encoder and an output signal indicative of generation of either one of underflow and overflow states from the underflow/overflow detector, and generating a base-level gain code corresponding to the generated state information;
    an offset-level gain code generator for receiving the output value from the encoder and the output signal indicative of generation of either one of underflow and overflow states from the underflow/overflow detector, and generating an offset-level gain code corresponding to the generated state information; and
    an adder for adding the base-level gain code and the offset-level gain code, and generating a gain code corresponding to the mean power detected by the power detector.

2. The apparatus as set forth in claim 1, wherein the power detector includes:
    a plurality of multipliers for squaring an input signal to acquire an instantaneous power of either a complex input signal or a real-number input signal;
    an adder for summing the squared signals received from the multipliers, and generating a power signal;

a sliding integrator for receiving the power signal from the adder, and calculating an accumulated value of the received power signal during a predetermined symbol interval; and a divider for receiving an integrated result value from the sliding integrator, and calculating a mean value of the integrated result value.

3. The apparatus as set forth in claim 1, wherein the gain control voltage generator includes:

a subtracter for subtracting a gain code corresponding to the mean power associated with the output signal of the variable gain amplifier from the target gain code to calculate an error code value;

a polarity controller for controlling polarity of the error code value generated from the subtracter according to polarity information associated with a control voltage of the variable gain amplifier;

a gain-lock check module for selecting a gain loop constant according to the error code value's magnitude calculated by the subtracter;

a DAC (Digital-to-Analog Conversion) code generator for multiplying the gain loop constant selected by the gain-lock check module by a unit-level gain, and generating a DAC code associated with the unit-level gain;

an accumulator for multiplying the output error code of the polarity controller by the unit-level DAC code generated from the DAC code generator to calculate a gain compensation code, and accumulating the calculated gain compensation code and a previous compensation value; and a D/A (Digital-to-Analog) converter for converting a gain control code generated from the accumulator into an analog voltage.

4. The apparatus as set forth in claim 3, wherein the polarity controller includes:

a fifth multiplexer for selecting either one of unit polarity values (+1, −1) according to a polarity control signal corresponding to polarity information of a gain control voltage of the variable gain amplifier; and a multiplier for multiplying the unit polarity value selected by the fifth multiplexer by the error code received from the gain code generator, and determining a gain control direction.

5. The apparatus as set forth in claim 3, wherein the gain-lock check module includes:

a-plurality of comparators for comparing consecutive error values adapted to divide a gain error generation range at intervals of a predetermined distance with the error code generated from the gain code generator, and generating a plurality of gain loop constant selection signals corresponding to individual ranges.

6. The apparatus as set forth in claim 3, wherein the DAC code generator includes:

a unit-level gain DAC code generator for calculating a DAC code associated with a unit-level gain;

a selector for selecting a corresponding gain loop constant upon receiving the gain loop constant selection signal from the gain-lock check module; and a multiplier for multiplying a gain loop coefficient selected by the selector by the DAC code generated from the unit-level gain DAC code generator.

7. The apparatus as set forth in claim 6, wherein the unit-level gain DAC code generator calculates a first value denoted by $$G_{dB\,Lstep} = \frac{10 \cdot \log_{10}(2)}{N_{LO}}$$

upon receiving the number $N_{LO}$ of overall gain levels, calculates a second value denoted by $$v_{Lstep} = \frac{10 \cdot \log_{10}(2) - G_c \cdot N_{LO}}{S_G \cdot N_{LO}}$$

to control the first value $$G_{dB\,Lstep} = \frac{10 \cdot \log_{10}(2)}{N_{LO}},$$

and generates a DAC code associated with the second value $$v_{Lstep} = \frac{10 \cdot \log_{10}(2) - G_c \cdot N_{LO}}{S_G \cdot N_{LO}}$$

using a third value denoted by $$C_{dac\,Lstep} = \frac{[10 \cdot \log_{10}(2) - G_c \cdot N_{LO}]}{S_g \cdot N_{LO} \cdot V_{dac\,range}}(2^{N_{dac}} - 1).$$

8. The apparatus as set forth in claim 1, wherein the base-level gain code generator includes:

a first multiplexer for selecting either one of the output signal of the encoder and the base-level gain code generated in the case of underflow upon receiving specific information indicative of the presence or absence of underflow;

a second multiplexer for selecting either one of the output signal of the first multiplexer and the base-level gain code generated in the case of overflow upon receiving specific information indicative of the presence or absence of overflow;

a subtracter for subtracting the output value of the second multiplexer 222 from a value of a-specific position at which a value of 1 is detected from a power bitstream associated with a maximum gain value; and a multiplier for multiplying the output value of the subtracter by the number of gain levels contained between one power and its doubled power, and outputting the multiplied result in the form of a base-level gain code.

9. The apparatus as set forth in claim 1, wherein the offset-level code generator includes:

an offset bitstream selector for selecting a plurality of bitstreams equal to the number $N_{offset}$ of offset levels upon receipt of the MSB position value of the encoder's output value;

a connector for receiving the bitstreams denoted by "NB Bits" from the offset level selector, and sequentially interconnecting the received bitstreams;

a subtracter for receiving the interconnection result value of the bitstreams from the connector, and subtracting the received value from a specific value of $(2^{NL\ is\ 2}-1)$ (where $NL_2$ is the number of gain levels contained between one power and its doubled power);

a third multiplexer for receiving information indicative of the presence or absence of underflow, and selecting either one of the output value of the subtracter and the offset-level value generated in the case of underflow on the basis of the received information; and a fourth multiplexer for receiving information indicative of the presence or absence of overflow, and selecting either one of the offset-level value generated in the case of overflow and the output value of the third multiplexer on the basis of the received information.

10. The apparatus as set forth claim 1, wherein the underflow/overflow detector includes:

a first comparator for comparing an underflow presence condition value with the output value of the encoder, determining if the encoder's output value is indicative of a specific bit position value less than the underflow presence condition value, and generating a signal indicative of the underflow presence when it is determined that the encoder's output value is indicative of the specific bit position value less than the underflow presence condition value; and a second comparator for comparing an overflow presence condition value with the output value of the encoder, determining if the encoder's output value is higher than the overflow presence condition value, and generating a signal indicative of the overflow presence when it is determined that the encoder's output value is higher than the overflow presence condition value.

* * * * *